(12) United States Patent
Chen et al.

(10) Patent No.: US 8,304,760 B2
(45) Date of Patent: Nov. 6, 2012

(54) SIDEWALL GRAPHENE DEVICES FOR 3-D ELECTRONICS

(75) Inventors: An Chen, Sunnyvale, CA (US); Zoran Krivokapic, Santa Clara, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 13/158,773

(22) Filed: Jun. 13, 2011

(65) Prior Publication Data

US 2011/0253983 A1      Oct. 20, 2011

Related U.S. Application Data

(62) Division of application No. 12/202,011, filed on Aug. 29, 2008, now Pat. No. 7,993,986.

(51) Int. Cl.
*H01L 29/06* (2006.01)

(52) U.S. Cl. .................. 257/27; 257/213; 257/E21.4

(58) Field of Classification Search .............. 257/27, 257/213, E21.4; 438/142, 164, 197, 198
See application file for complete search history.

(56) References Cited

U.S. PATENT DOCUMENTS

| | | |
|---|---|---|
| 6,838,322 B2 | 1/2005 | Pham et al. |
| 6,927,104 B2 | 8/2005 | Lee et al. |
| 6,974,983 B1 | 12/2005 | Hill et al. |
| 7,399,664 B1 | 7/2008 | Anderson et al. |
| 7,652,340 B2 | 1/2010 | Lee et al. |
| 2005/0184294 A1* | 8/2005 | Zhang ............................ 257/77 |
| 2007/0187694 A1* | 8/2007 | Pfeiffer .......................... 257/76 |
| 2009/0020764 A1 | 1/2009 | Anderson et al. |
| 2009/0095980 A1* | 4/2009 | Yu et al. ........................ 257/190 |
| 2009/0166686 A1* | 7/2009 | Hunt et al. .................... 257/288 |
| 2009/0181502 A1 | 7/2009 | Parikh et al. |

OTHER PUBLICATIONS

Berger et al. "Ultra Epitaxial Graphite: 2D Electron Gas Properties and a Route toward Graphene-based Nanoelectronics", J. Phys. Chem. B 2004, 108, pp. 19912-19916.
Gilje et al., "A Chemical Route to Graphene for Device Applications", Nano Letters, 2007, vol. 7, No. 11, pp. 3394-3398.
Novoselov et al., "Electric Field Effect in Atomically Thin Carbon Films", Science 306 (2004) pp. 1-5.

* cited by examiner

*Primary Examiner* — David Vu
*Assistant Examiner* — Duy T Nguyen
(74) *Attorney, Agent, or Firm* — Ditthavong Mori & Steiner, P.C.

(57) ABSTRACT

A device is provided that includes a structure having a sidewall surface, a layer of material provided on the sidewall surface, and a device structure provided in contact with the layer of material. Fabrication techniques includes a process that includes forming a structure having a sidewall surface, forming a layer of material on the sidewall surface, and forming a device structure in contact with the layer of material, where the device structure and the layer of material are components of a device.

9 Claims, 4 Drawing Sheets

US 8,304,760 B2

SIDEWALL GRAPHENE DEVICES FOR 3-D ELECTRONICS

CROSS-REFERENCE TO RELATED APPLICATION

The present application is a divisional application of U.S. application Ser. No. 12/202,011, filed on Aug. 29, 2008, the entire contents of which are herein incorporated by reference.

BACKGROUND OF THE INVENTION

1. Field of the Invention

The present invention relates to fabrication of devices having accurately formed designed features.

2. Discussion of the Background

Graphene is a flat monolayer of carbon atoms tightly packed into a two-dimensional honeycomb lattice that resembles chicken wire. It is the building block for graphite material. Graphene has attracted great attention for electronic applications due to its extremely high mobility (e.g., over 200,000 $cm^2/V\cdot s$) and some unique properties (e.g., bandgap modulation by structures). However, the fabrication methods for graphene devices are still quite rudimentary. Current methods lack good control of device dimensions and structures.

Graphene has some unique material properties that make it very attractive for electronic applications. Its mobility has been demonstrated to be above 200,000 $cm^2/V\cdot s$. Unlike the high mobility in some un-doped bulk semiconductors, graphene mobility remains high even at high carrier concentration. Carrier transport in graphene can be ballistic on a micrometer scale at room temperature. Similar to carbon nanotubes, graphene has ambipolar electric field effect, i.e., it can be electrically doped to become n-type or p-type depending on the gate voltage. The bandgap of semiconducting graphene can be modulated by its structure, e.g., the width of a graphene stripe. Graphene also has superior thermal conductivity that can enable some on-chip thermal management functions. As a natural two-dimensional system with planar form, graphene is easier to pattern than carbon nanotubes. Also, graphene can be potentially made with very low cost.

The first few-layer graphene was prepared by mechanical exfoliation of highly-oriented graphite. (See, e.g., K. S. Novoselov, et al, "Electric Field Effect in Atomically Thin Carbon Films", Science 306, 666 (2004).) Even a graphene monolayer can be prepared with this method; however, such a method is unsuitable for production. Another method of growing graphene is the thermal decomposition of SiC where Si atoms are removed and C atoms left behind form graphene-like structures in the surface layers. (See, e.g., C. Berger, et al., "Ultrathin Epitaxial Graphite: 2D Electron Gas Properties and a Route toward Graphene-based Nanoelectronics", J. Phys. Chem. B 108, 19912 (2004).) A drawback of this method is the high temperature (1400° C.) in this process. More methods are being developed including chemical synthesis. (See, e.g., S. Gilje, et al., "A Chemical Route to Graphene for Device Applications", Nano Lett. 7, 3394 (2007).) It is expected that some low-temperature material preparation methods suitable for production will be developed for graphene.

While graphene has attracted great attention for electronic applications, graphene has to be made extremely small (e.g., 10 nm or smaller) to exhibit some unique physical properties, and thus small resolution size for graphene features can be important for certain applications thereof. Such feature sizes can be smaller than current photolithography resolution. While E-beam lithography can achieve small sizes, achieving a size small enough for graphene device features can be challenging, and, in addition, E-beam lithography is not typically suitable for production as it is expensive and has low throughput.

Thus, the need exists to develop a process for forming devices with smaller feature sizes.

SUMMARY OF THE INVENTION

The present invention advantageously provides embodiments of a method that includes a process that includes forming a structure having a sidewall surface, forming a layer of material on the sidewall surface, and forming a device structure in contact with the layer of material, where the device structure and the layer of material are components of a device The present invention further advantageously provides embodiments of a device that includes a structure having a sidewall surface, a layer of material provided on the sidewall surface, and a device structure provided in contact with the layer of material.

BRIEF DESCRIPTION OF THE DRAWINGS

A more complete appreciation of the invention and many of the attendant advantages thereof will become readily apparent with reference to the following detailed description, particularly when considered in conjunction with the accompanying drawings, in which.

DETAILED DESCRIPTION OF EMBODIMENTS OF THE INVENTION

Figure 1A:
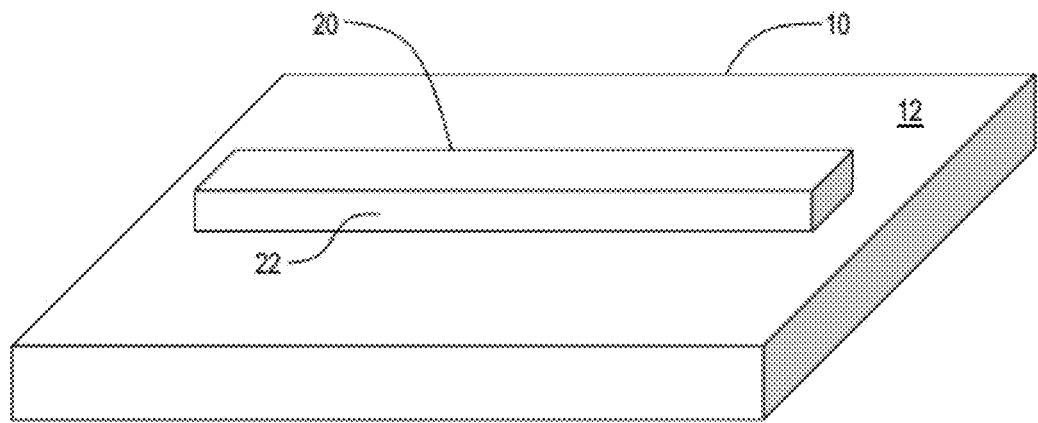
FIGS. 1A and 1B depict a process of forming a layer of material (e.g., graphene) of small scale, for example, that can be used to form a graphene-based device on sidewalls, according to an embodiment of the present invention.

Embodiments of the present invention will be described hereinafter with reference to the accompanying drawings. In the following description, the constituent elements having substantially the same function and arrangement are denoted by the same reference numerals, and repetitive descriptions will be made only when necessary.

Embodiments described herein allow for the formation of small scale layers of material that can be used, for example, as a basis for the formation of a semiconductor device or other device. In related methods, a layer of material is deposited or grown in a horizontal, planar configuration, and then etched to form a desired pattern of the material that can then be used to form a device. However, such processes may have resolution limits that do not allow for the formation of features of small enough scale. For example, as discussed above, graphene has attracted great attention for electronic applications due to its extremely high mobility (e.g., over 200,000 cm$^2$/V·s) and some unique properties (e.g., bandgap modulation by structures). However, some important properties of graphene (e.g., bandgap opening and modulation) only exist at extremely small size (e.g., a graphene stripe as narrow as less than 10 nm). It is a challenge to pattern and etch graphene or other materials to the desired size using known methods.

The embodiments described herein allow for the formation of small scale layers of material of graphene or any other desired material by forming a sidewall, either on a protruding structure such as a mesa or in a recess, and using the sidewall layer as a basis of the device. Since processing methods allow for the accurate control of the height of the sidewall (either of the mesa or of the recess), and since the height of the sidewall is used to define the width of the layer formed, the embodiments provide a method of forming an extremely narrow stripe of material, such as graphene, in an easy and effective manner.

The embodiments described herein also provide another advantage, which is to make three-dimensional device structures, or vertical devices. By building graphene on sidewall surfaces, the processes set forth herein extend graphene devices into three-dimensional spaces, and enable the formation of vertical device structures. This extension from planar graphene-based devices enables a greater variety of device structures. Such three-dimensional structures can advantageously be formed into a wide variety of different device structures.

Figure 1B:
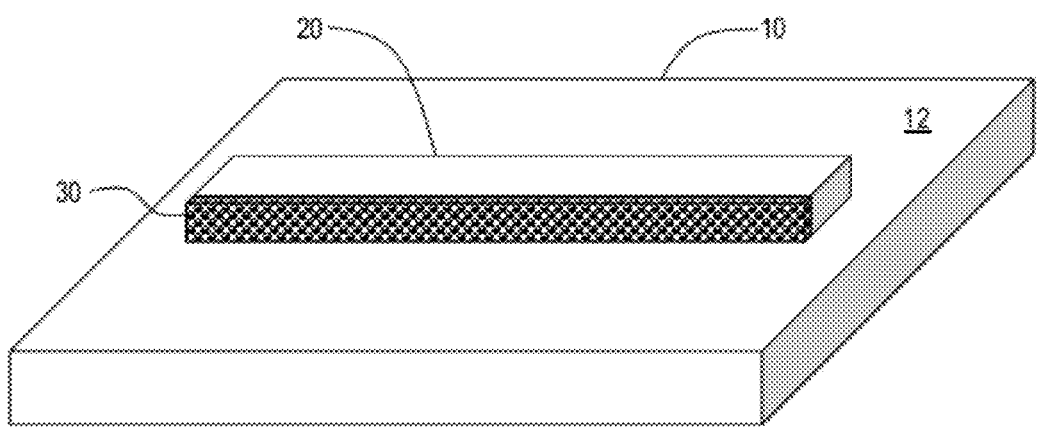

FIGS. 1A and 1B depict a process of forming a layer of material (e.g., graphene) of small scale, for example, that can be used to form a graphene-based device, according to an embodiment of the present invention.

In FIG. 1A, a substrate 10 is provided that has an upper surface 12. A protruding structure or mesa structure 20 is formed that protrudes upward from the upper surface 12 of the substrate. The mesa structure 20 can be etched from the material of the substrate 10, for example, by forming a mask over the mesa structure 20 and etching the exposed portions of the substrate. Alternatively, the mesa structure 20 can be formed by depositing or growing a material layer on the upper surface 12 of the substrate 10, and patterning to define the mesa structure 20. The mesa structure 20 is formed to have a sidewall surface 22 having the desired dimensions of length and height (also referred to herein as width). The length and height (also referred to herein as width) of the sidewall surface 22 will define the length and width of a material stripe formed thereon. The width of the sidewall surface can be controlled by controlling the etching process to form the desired width (i.e., the overall height of the mesa structure), and/or using additional processes (e.g., polishing, etc.) to further precisely control to final width. By way of example, sidewalls can be formed of 0.5 nm, or even 100 microns, in width.

In FIG. 1B, a material layer 30, such as a graphene stripe, is formed on the sidewall surface 22. The material layer 30 can be grown, deposited, or otherwise formed on the sidewall surface 22. For example, in one implementation, the mesa 20 can be formed by etching a substrate 10 of SiC, and thus a graphene layer (or nano-ribbon) 30 can be grown by thermal decomposition of the sidewall surface 22 of the SiC mesa 20. The orientation of surface 22 is chosen to be suitable for graphene growth (e.g., (0001) direction). At high temperatures during the thermal decomposition process, the surface layer of the SiC crystal on the sidewall surface 22 of the mesa 20 will decompose. With the Si atoms removed and the C atoms left on the surface, a thin layer of graphene will form on the sidewall surface 22 as layer 30. Since the top surfaces of the mesa and the substrate are at different orientations than the sidewall surface 22, the formation of graphene will generally only occur at a certain orientation (e.g., here, at the substantially vertical orientation of the sidewall surface 22) and thus graphene can be selectively formed on the sidewall surface 22 as layer 30.

The graphene layer 30 described above is prepared by growing graphene using thermal decomposition of a carbon-containing graphene precursor (such as, e.g., SiC). Other methods of forming the material layer 30 can be used. For example, regarding the formation of graphene layers, such layers can be prepared, for example, by using mechanical exfoliation of highly-oriented graphite, by using chemical synthesis, etc. For example, a layer of graphene can be prepared using mechanical exfoliation, and then the graphene layer can provided on the sidewall surface, and any additional width of the graphene layer that extends beyond edges of the sidewall surface can be removed to form a graphene layer of the desired width.

The graphene layer 30 depicted in FIG. 1B can then be used to form a graphene-based device, for example, by forming source/drain regions and a gate in contact therewith to form a field effect transistor (FET). One example of such a device can be seen in FIG. 4, and will be described below.

Figure 2A:
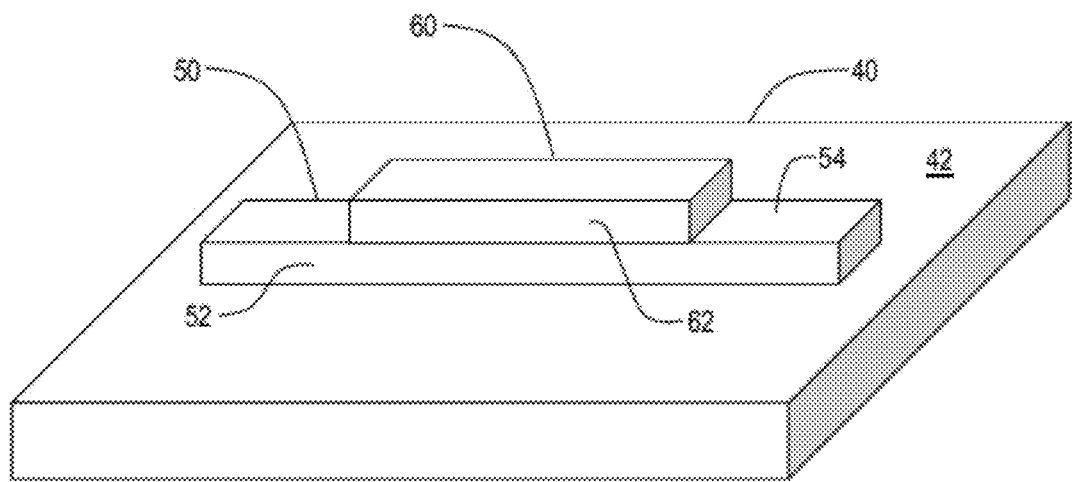
FIGS. 2A and 2B depict a process of forming a layer of material (e.g., graphene) of small scale having a varying shape, for example, that can be used to form a graphene-based heterojunction device, according to an embodiment of the present invention.
Figure 2B:
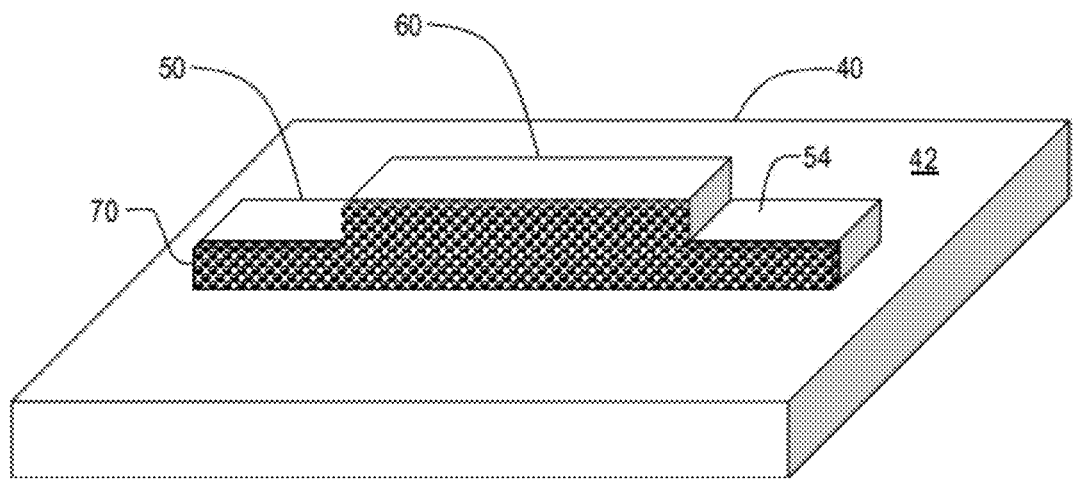

FIGS. 2A and 2B depict a process of forming a layer of material (e.g., graphene) of small scale having a varying shape, for example, that can be used to form a graphene-based device, according to an embodiment of the present invention. This embodiment notes that the mesa (or recess, as described below with respect to FIGS. 3A and 3B) can be patterned into different shapes to achieve different shapes, such as non-uniform shapes, of the material layer. Graphene nano-ribbons can be formed having different shapes in different portions thereof, for example, different portions can be formed with different heights or lengths, in order to form a sidewall nano-ribbon of varying shape.

In FIG. 2A, a substrate 40 is provided that has an upper surface 42. A first protruding structure or first mesa structure 50 is formed that protrudes upward from the upper surface 42 of the substrate 40. Additionally, a second protruding structure or second mesa structure 60 is formed that protrudes upward from an upper surface 54 of the first mesa structure 50. In this embodiment, the first mesa structure 50 is formed with a length greater than the second mesa structure 60. The first mesa structure 50 is formed to have a sidewall surface 52 having the desired dimensions of length and height, and the second mesa structure 60 is formed to have a sidewall surface 62 having the desired dimensions of length and height. The mesa structures 50 and 60 can also be formed with structure 60 first and structure 50 second, for example by etching. The lengths and heights of the sidewall surfaces 52 and 62 will define the length and height of a material stripe formed thereon.

In FIG. 2B, a material layer 70, such as a graphene stripe, is formed on the sidewall surfaces 52 and 62. The material layer 70 can be grown, deposited, or otherwise formed on the sidewall surfaces 52 and 62. The graphene layer 70 depicted in FIG. 2B can then be used to form a graphene-based heterojunction device due to the varying width of the sidewall stripe in different portion. The bandgap of semiconducting graphene stripe changes with the width of the stripe.

Figure 3A:
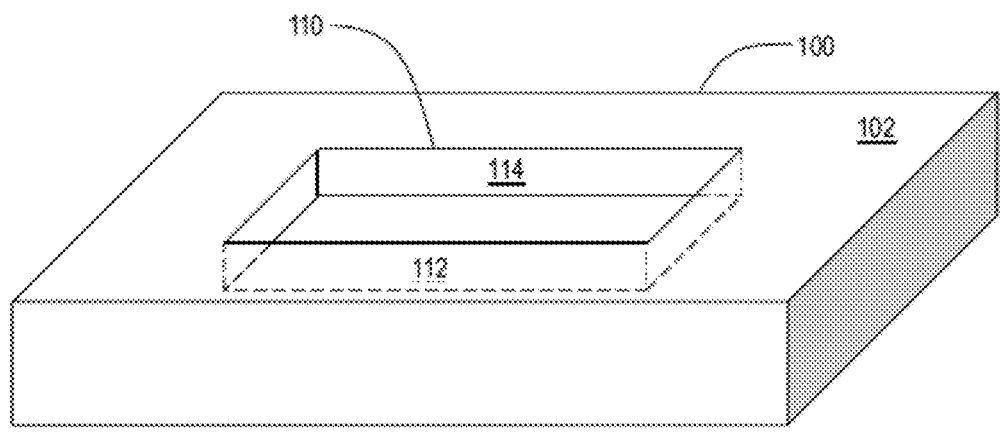
FIGS. 3A and 3B depict a process of forming layers of material (e.g., graphene) of small scale on a recessed structure, for example, that can be used to form a graphene-based device on recessed sidewalls, according to an embodiment of the present invention.
Figure 3B:
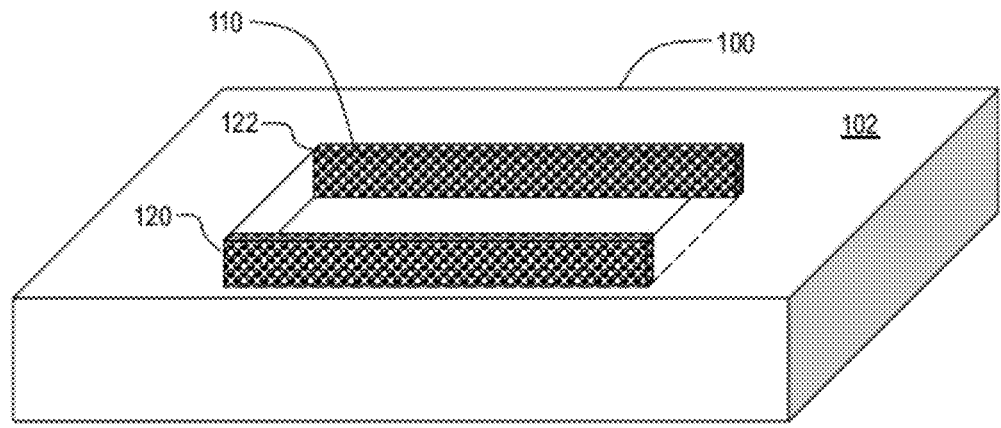

FIGS. 3A and 3B depict a process of forming layers of material (e.g., graphene) of small scale on a recessed structure, for example, that can be used to form a graphene-based device, according to an embodiment of the present invention. This embodiment notes that the sidewall layer can be formed on a sidewall surface of a recess.

In FIG. 3A, a substrate 100 is provided that has an upper surface 102. A recessed structure 110 is formed that protrudes downward from the upper surface 102 and within the substrate 110. The recessed structure 110 can be etched from the material of the substrate 100, for example, by forming a mask over the area outside of the recessed structure 110 and etching the exposed portions of the substrate. In this embodiment, the recessed structure 110 is formed with four sidewall surfaces, with a front sidewall surface 112 and a rear sidewall surface 114 being labeled. The various sidewall surfaces of the recessed structure 110 are formed to have the desired dimensions of length and height.

One or more of the sidewall surfaces of the recessed structure 110 can be formed with a sidewall material layer. In this embodiment, as shown in FIG. 3B, a first material layer 120, such as a graphene stripe, is formed on the front sidewall surface 112, and a second material layer 122, such as a graphene stripe, is formed on the rear sidewall surface 114. The material layers 120 and 122 can be grown, deposited, or otherwise formed on the sidewall surfaces 120 and 122.

Figure 3C:
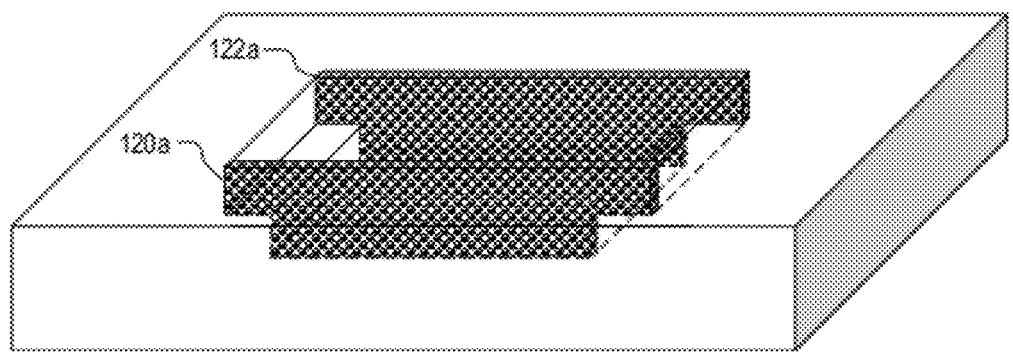
FIG. 3C depicts a process of forming layers of material (e.g., graphene) of small scale having varying shapes on a recessed structure, for example, that can be used to form a graphene-based device on recessed sidewalls, according to another embodiment of the present invention.

Thus, in this implementation graphene is formed on inner sidewall surfaces of an etched trench structure, rather than on a sidewall surface of a mesa structure. For example, the trench structure can be etched in an SiC substrate with the inner sidewall surfaces having orientations defined for the growth of graphene layers. After the formation of graphene on the inner sidewall surfaces, devices can be formed within the trench by forming source/drain contacts and gating structures. Similar to the sidewall device with varying width in FIG. 2A and FIG. 2B, sidewall device with varying width can also be formed in a recessed structure as shown in FIG. 3C having material layers 120a and 122a.

Figure 4:
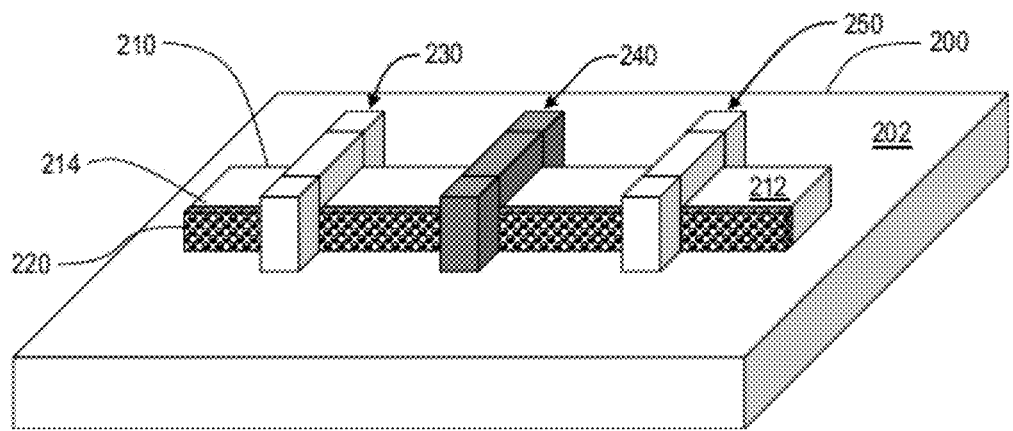
FIG. 4 depicts a perspective view of a graphene-based, FinFET-like, field effect transistor utilizing a sidewall graphene layer, according to an embodiment of the present invention.

FIG. 4 depicts a perspective view of a graphene-based field effect transistor of a FinFET configuration utilizing a sidewall graphene layer, according to an embodiment of the present invention. The embodiment shown in FIG. 4 includes an underlying structure similar to that depicted in FIG. 1B. Thus, a substrate 200 is provided that has an upper surface 202, and a mesa structure 210 is formed that protrudes upward from the upper surface 202 of the substrate. The mesa structure 210 is formed to have an upper surface 212 and a sidewall surface 214. A material layer 220, such as a graphene stripe, is formed on the sidewall surface 214.

Using the above structure, a field effect transistor (FET) structure similar to a FinFET structure is built using the graphene layer 220. Thus, a source structure 230, a gate structure 240, and a drain structure 250 are formed over the mesa structure (or fin-like structure) 210 and in contact with the graphene layer 220. Similarly, various other types of graphene-based devices (e.g., diodes) can be made on graphene layer formed on sidewalls.

By building graphene on sidewall surfaces, the processes set forth herein extend graphene devices into three-dimensional spaces, and enable the formation of vertical device structures. This extension from planar graphene-based devices enables a greater variety of device structures. Such structures can advantageously be formed similar to FinFET structures, as double-gate, or even multi-gate transistors. Graphene layers can be formed as extremely thin stripes of graphene that allow the unique features of graphene to be achieved in various electronic applications.

It should be noted that the exemplary embodiments depicted and described herein set forth the preferred embodiments of the present invention, and are not meant to limit the scope of the claims hereto in any way. Numerous modifications and variations of the present invention are possible in light of the above teachings. It is therefore to be understood that, within the scope of the appended claims, the invention may be practiced otherwise than as specifically described herein.

What is claimed is:

1. A device comprising:
a structure having a sidewall surface, said structure being formed as a first mesa structure provided on a substrate and having a first length and a second mesa structure provided on said first mesa structure and having a second length that differs from the first length, said second mesa structure adjoining said first mesa structure to form said sidewall surface, said sidewall surface being continuous and planar, and having a varying height dimension and a varying length dimension;
a layer of material provided on said sidewall surface, said layer of material having a varying width dimension and a varying length dimension corresponding to the varying height dimension and the varying length dimension of said sidewall surface, respectively; and
a device structure provided in contact with said layer of material,
wherein said layer of material is a graphene layer.

2. The device according to claim 1, wherein said first mesa structure and said second mesa structure are formed by etching said substrate.

3. The device according to claim 1, wherein said structure is formed of a carbon-containing graphene precursor material.

4. The device according to claim 1, wherein:
said structure having the sidewall surface is formed of a carbon-containing graphene precursor material; and
said layer of material on said sidewall surface is formed by thermally decomposing said carbon-containing graphene precursor material to form the graphene layer.

5. A device comprising:
a structure having a sidewall surface, said sidewall surface being continuous and planar, and said sidewall surface having a varying height dimension and a varying length dimension;
a layer of material provided on said sidewall surface, said layer of material having a varying width dimension and a varying length dimension corresponding to the varying height dimension and the varying length dimension of said sidewall surface, respectively; and
a device structure provided in contact with said layer of material,
wherein said structure is a first mesa structure provided on a substrate, and a second mesa structure provided on said first mesa structure, or
wherein said structure is a first recessed structure extending within said substrate, and a second recessed structure extending within said substrate, and
wherein said layer of material is a graphene layer.

6. The device according to claim 5, wherein said structure is formed by etching said substrate.

7. The device according to claim 5, wherein said structure is formed of a carbon-containing graphene precursor material.

8. The device according to claim 5, wherein said structure has a second sidewall surface, said device further comprising:
a second layer of material on said second sidewall surface, wherein said second layer of material is configured to be provided in contact with a second device structure.

9. The device according to claim 5, wherein:
said structure having the sidewall surface is formed of a carbon-containing graphene precursor material; and
said layer of material on said sidewall surface is formed by thermally decomposing said carbon-containing graphene precursor material to form the graphene layer.

* * * * *